United States Patent [19]

Kim et al.

[11] Patent Number: 5,547,901
[45] Date of Patent: Aug. 20, 1996

[54] METHOD FOR FORMING A COPPER METAL WIRING WITH ALUMINUM CONTAINING OXIDATION BARRIER

[75] Inventors: Jun K. Kim; Kyung I. Lee, both of Seoul, Rep. of Korea

[73] Assignee: LG Semicon Co., Ltd., Chungcheongbuk-do, Rep. of Korea

[21] Appl. No.: 445,107

[22] Filed: May 19, 1995

[30] Foreign Application Priority Data

May 24, 1994 [KR] Rep. of Korea ............... 11304/1994

[51] Int. Cl.$^6$ .................................................. H01L 21/28
[52] U.S. Cl. .................... 437/187; 437/190; 437/194; 437/198
[58] Field of Search ............................. 437/187, 194, 437/198, 203, 246, 190

[56] References Cited

U.S. PATENT DOCUMENTS

| | | | |
|---|---|---|---|
| 4,742,014 | 5/1988 | Hooper et al. | 437/192 |
| 4,931,410 | 6/1990 | Tokunaga et al. | 437/189 |
| 5,098,516 | 3/1992 | Norman et al. | 156/666 |
| 5,273,775 | 12/1993 | Dyer et al. | 427/99 |
| 5,312,774 | 5/1994 | Nakamura et al. | 437/192 |
| 5,340,370 | 8/1994 | Cadien et al. | 51/308 |
| 5,354,712 | 10/1994 | Ho et al. | 437/192 |
| 5,447,599 | 9/1995 | Li et al. | 437/190 |
| 5,470,789 | 11/1995 | Misawa | 437/190 |

FOREIGN PATENT DOCUMENTS

| | | |
|---|---|---|
| 2-206122 | 8/1990 | Japan . |
| 5-102155 | 4/1993 | Japan . |
| 06061224 | 3/1994 | Japan . |

*Primary Examiner*—George Fourson
*Assistant Examiner*—Thomas G. Bilodeau
*Attorney, Agent, or Firm*—Finnegan, Henderson, Farabow, Garrett & Dunner, L.L.P.

[57] ABSTRACT

A method for forming a metal wiring of a semiconductor element, which uses an aluminum film as an oxidation prevention film to prevent oxygen from being diffused into copper contained in the metal wiring. An aluminum oxidation prevention film layer is selectively formed on an exposed surface of the copper metal wiring layer using a selective chemical vapor deposition method. The width of the aluminum layer formed is below 100Å, and is converted into $Al_2O_3$ at heat treating or under an atmosphere, thereby preventing the copper from oxidation. A diffusion prevention film between the substrate and the copper metal wiring layer is further included for preventing the copper from diffusing into the substrate.

13 Claims, 2 Drawing Sheets

METHOD FOR FORMING A COPPER METAL WIRING WITH ALUMINUM CONTAINING OXIDATION BARRIER

BACKGROUND OF THE INVENTION

1. Field of the Invention

This invention relates to a metal wiring on a semiconductor element, and related method. In particular, the present invention uses an aluminum film to prevent oxygen from being diffused into copper contained in the metal wiring.

2. Description of the Related Art

In ULSI (Ultra Large Scale Integrated Circuit) class semiconductor elements, copper (Cu) is used for the metal wiring layer. Copper has a lower resistivity than aluminum and excellent electro-migration characteristics. However, since copper is susceptible to oxidation, a metal wiring formed of copper should be covered with a protective layer to prevent oxidation.

FIG. 1 is a sectional view of a conventional semiconductor element having a copper metal wiring layer. Briefly, a copper metal wiring layer 2 having an exposed surface is formed on a designated part of a semiconductor substrate 1. An oxidation prevention film 3 is then formed on the exposed surface of the copper metal wiring layer 2 for inhibiting diffusion of oxygen into the copper.

A method for forming the structure shown in FIG. 1 will now be discussed in greater detail.

First, a copper film is deposited on an exposed surface of the semiconductor substrate 1. Then, the deposited copper film is patterned around a pattern mask using a photoetching process to form the copper metal wiring layer 2. An oxidation prevention insulation film is then deposited on the entire exposed surface of the substrate to a thickness of about 500Å. The deposited oxidation prevention insulation film is selectively removed around a pattern mask using a photoetching process to form the oxidation prevention film 3.

The oxidation prevention film 3 prevents oxygen from being diffused into the copper metal wiring layer 2 during a heat treatment in an atmosphere such as in an oxygen atmosphere. The oxidation prevention film includes, for example, TiN, TiW, TiWN, TaN, NbN, or a single metal layer of Ti, Cr or W. In general, however, the oxidation prevention film is composed of a stable chemical with a low mutual solid solubility, a low mutual diffusing speed, and a material that inhibits the diffusion of oxygen for the oxidation prevention film. As a result, as shown in FIG. 2, which illustrates the distribution of oxygen density at each layer of the semiconductor element shown in FIG. 1, even though the semiconductor is subjected to a heat treatment in an atmosphere such as oxygen, the oxidation prevention film prevents oxygen from being diffused into the metal wiring layer 2.

The conventional semiconductor element has the following problems.

First, the conventional method for fabricating the metal wiring is complicated because, it is necessary to both deposit and pattern the copper and the oxidation prevention material, requiring several mask steps.

Second, element integration is reduced due to the increased line width of the metal wiring layer. Further, since the oxidation prevention film has a thickness of about 500Å, the resistance of the metal wiring is significantly increased, thereby deteriorating electrical characteristics of the wiring layer.

SUMMARY OF THE INVENTION

The present invention has been made in view of the above circumstances and has as an object to provide a simplified method for forming a metal wiring layer having an aluminum oxidation prevention film, which can improve the element integration and the electrical characteristics of the element.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method for fabricating a metal wiring of this invention includes forming a copper metal wiring layer on a substrate and forming an aluminum oxidation prevention film by selectively forming an aluminum thin film layer on an exposed surface of the copper metal wiring layer.

The aluminum oxidation prevention film can be formed in two ways. First, an aluminum thin film can be deposited on the entire exposed surface of the substrate having the copper metal wiring layer formed thereon using a chemical vapor deposition method and carrying out a photoetching of the aluminum thin film. Second, the oxidation prevention layer can be selectively formed on the exposed copper metal wiring layer using a chemical vapor deposition method.

A further embodiment of this invention for fabricating a metal wiring for a semiconductor element includes the steps of depositing and patterning a diffusion prevention film on a semiconductor substrate, selectively forming a copper metal wiring layer on the surface of the diffusion prevention film using a chemical vapor deposition method, and forming an oxidation prevention film on the exposed surface of the copper metal wiring layer using a selective chemical vapor deposition method.

Another embodiment of this invention for fabricating a metal wiring for a semiconductor element includes the steps of forming an insulation film of a designated pattern on a semiconductor substrate, forming a plurality of trenches by etching the insulation film, forming a copper metal wiring layer buried in the trenches by depositing a copper metal wiring layer using a chemical vapor deposition method, etching the copper metal wiring layer using a chemical mechanical polishing method, and forming an oxidation prevention film on the exposed surface of the copper metal wiring layer.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE INVENTION

Figure 1:
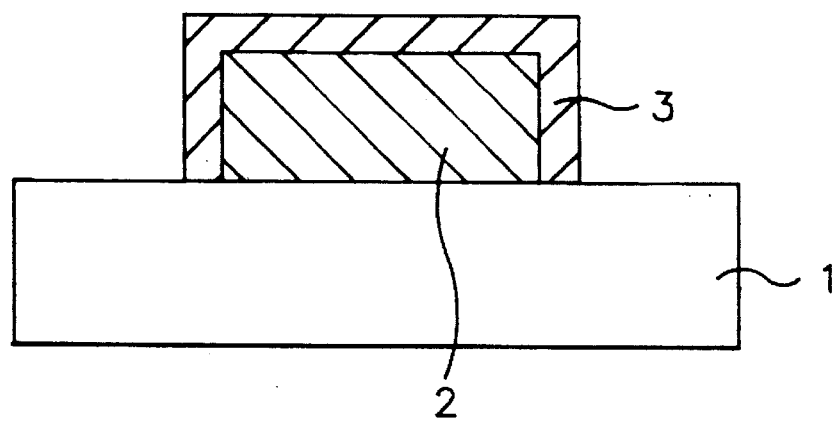
FIG. 1 is a sectional view of a conventional semiconductor element having an oxidation prevention film formed on a copper metal wiring layer.
Figure 2:
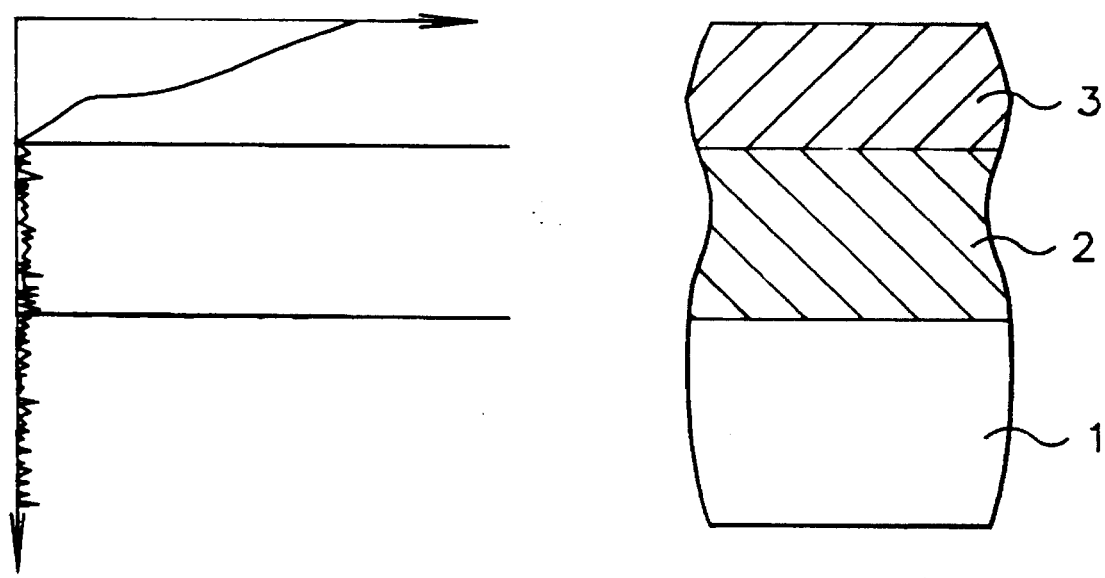
FIG. 2 shows the distribution of oxygen density at each layer of the semiconductor element having an oxidation film formed on a copper metal wiring layer.
Figure 3:
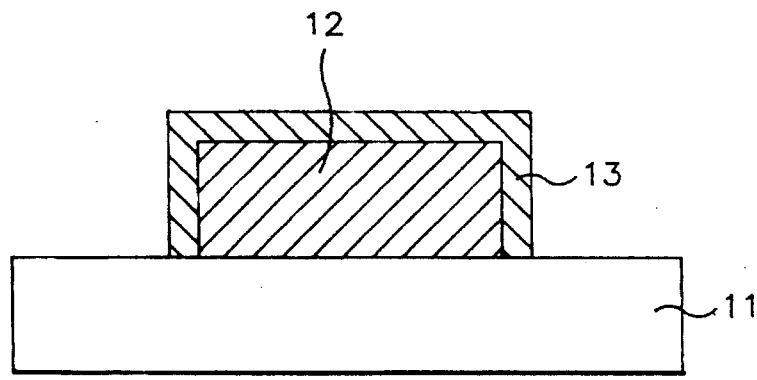
FIG. 3 is a sectional view of a semiconductor element having an oxidation prevention film formed of aluminum on a metal wiring layer in accordance with a first embodiment of this invention.

A method for forming a metal wiring in accordance with a first embodiment of the present invention will now be described with reference to FIG. 3. As shown in FIG. 3, a copper wiring layer 12 is formed on a designated part of a semiconductor substrate 11 and has an exposed surface. An oxidation prevention film 13 is then formed on the exposed surface of the copper wiring layer 12.

The copper wiring layer 12 is formed by depositing a copper layer on the entire exposed surface of the substrate. The deposited copper layer is patterned around a pattern mask using a photoetching process to form the copper metal wiring layer.

The oxidation prevention film 13 is created by forming an aluminum thin film layer, with a thickness less than 100Å, on the entire exposed surface of the substrate. The aluminum thin film layer is selectively photoetched such that the film is left only on the exposed surface of the copper metal wiring layer 12.

Alternatively, the oxidation prevention film 13 can be formed by depositing an aluminum thin film layer on only the exposed surface of the copper metal wiring layer 12 on the semiconductor substrate 11 by using a selective chemical vapor deposition (CVD) method.

Figure 4:
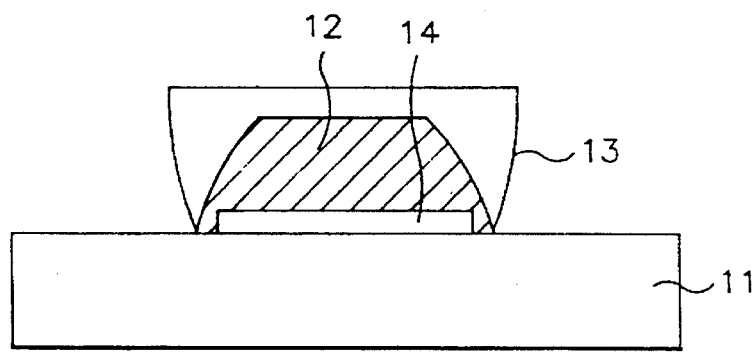
FIG. 4 is a sectional view of a semiconductor element having an oxidation prevention film formed of aluminum on a metal wiring layer in accordance with a second embodiment of this invention.

FIG. 4 shows a sectional view of a semiconductor metal wiring in accordance with a second embodiment of this invention. A copper metal wiring layer 12 is formed on a designated part of a semiconductor substrate 11. A diffusion prevention layer 14 is formed between the semiconductor substrate 11 and the copper metal wiring layer 12 for preventing the copper from diffusing into the substrate. An aluminum oxidation prevention film 13 is then formed on the exposed surface of the copper metal wiring layer 12 for preventing oxygen from diffusing into the copper layer.

The method for forming the metal wiring in accordance with the second embodiment of this invention includes, first, depositing a diffusion prevention film 14 to a thickness greater than 100Å on the entire exposed surface of the semiconductor substrate 11. The deposited diffusion prevention film is patterned around a pattern mask using a photoetching process to form the diffusion prevention film 14.

Then, a copper metal wiring layer 12 is formed on the surface of the diffusion prevention film 14, and an aluminum oxidation prevention film 13 is formed on the exposed surface of the copper metal wiring layer 12 using a selective chemical vapor deposition method.

In accordance with a further method of the present invention, the copper metal wiring layer 12 and the diffusion prevention film 14 are stacked successively on the substrate 11 using a sputtering method or a CVD method. These two layers are then patterned in a subsequent step. An aluminum oxidation prevention film 13 is then formed on the exposed surface of the diffusion prevention layer 14 and the copper metal wiring layer 12 using a selective CVD method.

Stable chemicals, such as W, TiN, TaW, and NbN, are used for the diffusion prevention layer 14. The width of the copper metal wiring layer 12 should be the same as, or narrower than the width of the diffusion prevention layer 14.

Figure 5:
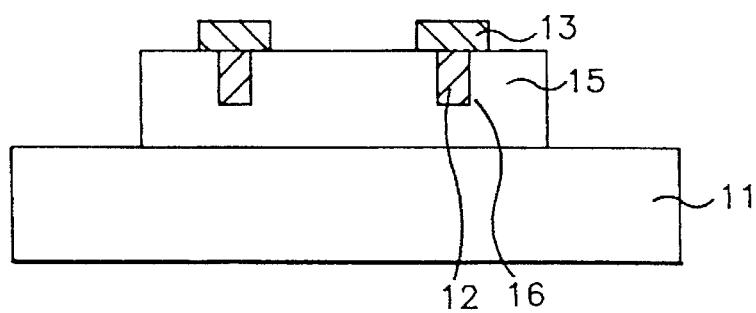
FIG. 5 is a sectional view of a semiconductor element having an oxidation prevention film formed of aluminum on a metal wiring layer in accordance with a third embodiment of this invention.

FIG. 5 shows a sectional view of a metal wiring on a substrate in accordance with a third embodiment of this invention. An insulation film 15 is formed on a semiconductor substrate 11 having a plurality of trenches 16. Copper metal wiring layers 17 are then buried in the trenches 16 and leveled with a top surface of insulation film 15. A plurality of oxidation prevention films 13 are then formed on the surface of the copper metal wiring layer 17. The insulation film 15 is subsequently formed on the entire exposed surface of the semiconductor substrate 11, and is selectively removed from designated parts using a photoetching process.

A process for making the device shown in FIG. 5 will now be discussed in more detail.

The area for forming a primary copper metal wiring layer is defined using a mask for a metal pattern and the defined area on the insulation film 15 is etched to a predetermined depth. As a result, the trenches 16 are formed in the insulation film 15 having an appropriate predetermined depth.

Then, a copper metal wiring layer 17 is deposited on the insulation film using a CVD method so that the trenches 16 in the insulation film 15 are completely filled with the copper metal wiring layer 17. The copper metal wiring layer 17 is then buried in the trenches 16 using a chemical mechanical polishing (CMP) method.

The semiconductor metal wiring is completed by forming an aluminum oxidation prevention film on the exposed surface of the copper metal wiring layer 17 using a selective chemical vapor deposition method. The copper wiring layer 17 buried in the trenches 16 in the insulation film 15 is then made level or even with the top surface insulation film 15.

In the foregoing embodiments, the aluminum thin film of the oxidation prevention film 13 is oxidized into $Al_2O_3$ during heat treating in an atmosphere such as an oxygen atmosphere. $Al_2O_3$ acts as a protective film by preventing the copper formed below it from being oxidized.

If the thickness of the aluminum thin film is more than 500Å, the aluminum thin film is partially oxidized but not completely oxidized. Accordingly, the metal wiring layer is converted into an alloy film of copper and aluminum which increases resistance. Therefore, the aluminum thin film should have a thickness preferably less than 100Å.

The method for fabricating a metal wiring for a semiconductor element in accordance with this invention has the following advantages.

First, the oxidation prevention layer includes an aluminum thin film as an insulation film formed using a chemical vapor deposition method and thereby eliminates the masking processes, simplifying the method.

Second, by forming an aluminum oxidation prevention film at a thickness less than 100Å instead of a thickness of 500Å and by using stable chemicals, such as TiN and TiW, it is possible to improve the integration of the element as well as the electrical characteristics of the element owing to the low resistance.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating a metal wiring of a semiconductor element comprising the steps of:

forming a copper metal wiring layer on a substrate, said copper metal forming an oxidation prevention film by selectively forming an aluminum film having a thickness less than 100Å, on said exposed surface of said copper metal wiring layer thereby preventing oxidation of the copper metal wiring and completely oxidizing the oxidation prevention film.

2. The method as claimed in claim 1, wherein said oxidation prevention film is formed using a chemical vapor deposition method.

3. The method as claimed in claim 1, wherein said oxidation prevention film is formed by depositing an aluminum film on said exposed surface of said copper metal wiring layer and on said substrate using a chemical vapor deposition method, and photolithographically patterning said aluminum film to remove said deposited aluminum film on said substrate.

4. A method for fabricating a metal wiring of a semiconductor element comprising the steps of:

forming a copper metal wiring layer on a part of a substrate, said copper metal wiring layer having an exposed surface;

forming a diffusion prevention layer to prevent diffusion between said part of said substrate and said copper metal wiring layer; and forming an oxidation prevention film having a thickness less than 100Å on said exposed surface of said copper metal wiring layer, wherein said oxidation prevention film includes aluminum, and prevents oxidation of said copper metal wiring layer and completely oxidizing the oxidation prevention film.

5. The method as claimed in claim 4, wherein said diffusion prevention film is selected from the group consisting of NbN, TiW, TiN, TaN, and W.

6. The method as claimed in claim 5, wherein a thickness of said diffusion prevention film is formed greater than 100Å.

7. The method as claimed in claim 4, wherein said diffusion prevention film is formed by using a chemical vapor deposition method to deposit said diffusion prevention film and by patterning said deposited diffusion prevention film, said diffusion prevention film having an exposed surface and said copper metal wiring layer being formed only on said exposed surface of said diffusion prevention film using a selective chemical vapor deposition method.

8. The method as claimed in claim 7, wherein a width of said copper metal wiring layer is less than or equal to a width of said diffusion prevention layer.

9. The method as claimed in claim 4, wherein said diffusion prevention layer and said copper metal wiring layer are successively formed using a chemical vapor deposition method, and are subjected to a photolithographic patterning process.

10. The method as claimed in claim 9, wherein said aluminum oxidation prevention film is formed using a selective chemical vapor deposition method.

11. A method for fabricating a metal wiring of a semiconductor element comprising the steps of:

forming an insulation film on a semiconductor substrate;

forming trenches in said insulation film using a photolithographic patterning process;

forming a copper metal wiring layer in said trenches of said insulation film; and forming an oxidation prevention film having a thickness less than 100Å on said copper metal wiring layer, wherein said oxidation prevention film includes aluminum and prevents oxidation of said copper metal wiring layer and completely oxidizing the oxidation prevention film.

12. The method as claimed in claim 11, wherein said copper metal wiring layer is formed using a chemical vapor deposition method to deposit a copper metal wiring layer on said insulation film and in said trenches, and using a chemical mechanical polishing method to etch the surfaces of said insulation film and said copper metal wiring layer until a top surface of said copper metal wiring layer is level with a top surface of said insulation film.

13. The method as claimed in claim 11, wherein said oxidation prevention film is formed using a selective chemical vapor deposition method.

\* \* \* \* \*

UNITED STATES PATENT AND TRADEMARK OFFICE
CERTIFICATE OF CORRECTION

PATENT NO. : 5,547,901
DATED : August 20, 1996
INVENTOR(S) : Jun Ki KIM et al.

It is certified that error appears in the above-indentified patent and that said Letters Patent is hereby corrected as shown below:

Claim 1, Column 5, Line 15, after "metal", insert --wiring layer having an exposed surface; and--.

Claim 1, Column 5, Line 18, after "100 Å", delete ",".

Signed and Sealed this

Twenty-ninth Day of April, 1997

Attest:

Attesting Officer

BRUCE LEHMAN

Commissioner of Patents and Trademarks